(12) United States Patent
Barry et al.

(10) Patent No.: US 7,590,917 B2
(45) Date of Patent: Sep. 15, 2009

(54) PARAMETER GENERATION FOR INTERLEAVERS

(75) Inventors: Mark Patrick Barry, Waverley (AU); Benjamin John Widdup, Glenwood (AU)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 1295 days.

(21) Appl. No.: 10/427,833

(22) Filed: May 1, 2003

(65) Prior Publication Data

US 2004/0220988 A1    Nov. 4, 2004

(51) Int. Cl.
    *H03M 13/00* (2006.01)
(52) U.S. Cl. .............. 714/761; 714/762; 714/787; 714/788
(58) Field of Classification Search ............... 714/761, 714/762, 787, 788
    See application file for complete search history.

(56) References Cited

U.S. PATENT DOCUMENTS 5,042,033 A * 8/1991 Costa ............... 714/701
2002/0110240 A1 * 8/2002 Chen et al. ............... 380/28
2003/0065697 A1 * 4/2003 Patel et al. ............... 708/491
2004/0103134 A1 * 5/2004 Cookman et al. ......... 708/620

OTHER PUBLICATIONS

PCE 03 3GPP Turbo Encoder, Small World Communications, Sep. 22, 2001 (Version O.41).
PCE 03 3GPP Turbo and Viterbi Encoder, Small World Communications, Jun. 3, 2002 (Version O.64).
Turbo Encoder and Decoder for ASIC Implementation, Adelante Technologies www.adelantetech.com, info@adelantetech.com.

* cited by examiner

*Primary Examiner*—Guy J Lamarre

(57) ABSTRACT

An interleaver parameter generator circuit used to calculate and generate on an as needed basis interleaver parameters for interleaving blocks of information of varying lengths in accordance with a pseudorandom pattern defined by the 3GPP standard. The interleaver parameter generator circuit calculates and generates the defined interleaver parameters based on an input parameter that represents the length of the block of information to be interleaved. At least one of the defined parameters is calculated and generated using a decomposed form of its definition. The interleaver parameter generator circuit uses well known circuit blocks such as multipliers, subtractors, Compare-and-Select circuits and other circuits to calculate and generate the defined parameters.

20 Claims, 4 Drawing Sheets

PARAMETER GENERATION FOR INTERLEAVERS

BACKGROUND OF THE INVENTION

1. Field of the Invention

The present invention is related to interleavers used in systems such as communication systems.

2. Description of the Related Art

Interleavers are processing entities that manipulate data or information in a certain well defined manner. Interleavers alter the time order of the data or information. A block of information (or data) is typically arranged as a plurality of consecutive sub-blocks having a proper order. An interleaver re-arranges the time order of these sub-blocks in accordance with a specific pattern. The pattern is a well defined deterministic pattern, and sometimes it is a pseudorandom pattern. The process of interleaving is used in many information processing systems including wireless and wireline communication systems.

It is well known in communication systems to code information prior to their transmission over communication channels. The coding of information prior to transmission over a communication channel is a well known technique used by communication system designers to make the information less vulnerable to noise that may exist in the channel. An example of coding, which is used particularly in wireless communication systems, is turbo coding and decoding. Turbo coding, in part, uses the interleaving process to add redundancy to the information and increase the codeword weight in a particular manner. A codeword is formed when information bits in a code block are used to generate parity bits where the resultant redundant parity bits are combined with the information bits to form a code word. The weight of a code word is defined as the minimum distance between any two code words; the weight is also referred to as the Hamming weight. Interleavers are thus a key component of turbo encoders and decoders.

The basic approach to the design of interleavers is to first store the information (i.e., sub-blocks of the information) in known memory locations or memory addresses. The contents of the memory locations are then retrieved in accordance with some predefined pattern that can be random, pseudorandom or deterministic. By retrieving the stored memory addresses in accordance with the pattern, the corresponding sub-blocks of information are retrieved in accordance with the pattern thus achieving the interleaving of the information. The interleaver address pattern can change depending on the length of the sub-block of data in many interleaver implementations. Hence, a separate address pattern for each possible block length would be needed.

Various circuits or algorithms are used to generate the address pattern that indicates which particular order the stored information is to be retrieved. Many pseudorandom interleaver designs are implemented using Digital Signal Processors (DSP) and lookup tables to calculate the interleaving addresses in accordance with a pattern. An interleaver can also be implemented using an SRAM (Static Random Access Memory), a ROM (Read Only Memory), an EPROM (Erasable Programmable Read Only Memory) or any other memory containing the scrambling addresses. Thus, the conventional approach to designing interleavers uses ROMs, RAMs or other memory circuits in which the interleaver addresses are stored.

When implemented with ROMs, the contents of the locations (i.e., interleaver addresses) in the ROM are pre-calculated offline during the design of the interleaver and hard-coded into the memory for all possible block lengths. When implemented with RAMs, the contents of the locations of the RAM can either be populated with pre-calculated address locations for all possible block lengths or the address locations can be calculated by a separate processor (e.g., Digital Signal Processor (DSP)) at runtime for each block length's specific pattern as it is needed. The contents of the memory locations in either the RAMs or the ROMs are pointers that point to certain addresses thus implementing a particular interleaving pattern. As previously stated, the interleaving pattern can be pseudorandom. In some current wireless communication systems, pseudorandom patterns for interleavers are used as part of the turbo coding and decoding operations. In particular, the $3^{rd}$ Generation Partnership Project (3GPP) group has promulgated the Group Radio Access Network Standard TS 25.212 V4.2.0 (2002-09) wherein a specific procedure for generating a pseudorandom pattern for interleavers used in turbo coders and decoders is disclosed. Specifically, certain interleaving parameters are defined and the particular method of calculation of these parameters is also defined in sub-sections 4.2.3.2.3.1-4.2.3.2.3.3.

A common method of generating pseudorandom interleaving patterns relies heavily on the use of the MOD (modulus) operation. The MOD operation is a well known operation in residue number theory. The result of the MOD operation is a remainder after an arithmetic division operation is performed. The MOD operation is defined in the following manner:

$$a \text{ MOD } b \equiv \text{remainder of } \frac{a}{b}.$$

Thus, for example 12 MOD 4=0 because 12 divided by 4 equals 3 with remainder 0; another example is 12 MOD 5=2; 135 MOD 6=3 and so on. The MOD operation is implemented using division or several steps of addition, comparison and subtraction which require more than one clock cycle to achieve. Also, MOD operations require relatively large amounts of computing/processing power and circuit area in order to compute a MOD value relatively quickly. For example, in one implementation where MOD operations (up to mod 33) are implemented using hardware, 20.6 mm$^2$ of silicon may be required. Also, because the computing process usually takes several clock cycles to complete a single MOD operation, an undesirable delay is usually introduced.

Interleaver designs in which pseudorandom interleaving patterns for different information lengths are considered are usually implemented with ROMs or RAMs that use (1) relatively large amounts of processing power (2) relatively large amounts of circuit space and/or a DSP and (3) introduce substantial amounts of delay in the processing time. Interleavers that can generate addresses as per a defined pattern without having to pre-populate a RAM or ROM thus avoiding the just mentioned disadvantages are therefore desirable.

A turbo interleaver address generator designed in accordance with the 3GPP (Third Generation Partnership Project) wireless standard is part of known art. The interleaver disclosed in the known art is able to generate addresses that follow a specific pattern (specified in sub-sections 4.2.3.2.3.1-4.2.3.2.3.3 of the 3GPP standard) which has been determined by the 3GPP standard to have desirable random probabilistic characteristics.

The interleaver address generator disclosed in the known art is able to calculate interleaver addresses (based on the 3GPP defined interleaver parameters) on an as-needed basis ("on the fly") using a relatively small amount of hardware; the known art interleaver address generator generates an address every clock cycle. The ability to calculate interleaver addresses on the fly using a relatively small amount of hardware results in a significant improvements in (a) power consumption, (b) latency in processing and (c) size of circuitry. The interleaver address generator disclosed in the known art uses certain 3GPP standard defined interleaver parameters as inputs and generates the interleaver addresses based on these inputs. Because the interleaver address generator disclosed in the known art calculates addresses on an as-needed basis (i.e., on the fly), the interleaver parameters that it uses to calculate such addresses have to be available on the fly or have to be calculated on the fly.

One of the parameters used by the known art interleaver address generator is K which represents the block length of the information to be interleaved. As new blocks of information to be interleaved arrive, the value of K changes because typically the blocks of information have varying lengths. The remaining parameters as defined in the standard (discussed infra) are calculated based on the value of K. Thus, in order for the interleaver address generator to calculate addresses on the fly, a new set of parameters have to be calculated and made available for a new value of K. The terms "on the fly" or "on an as-needed basis" refer to the calculation of new parameters for new values of K and making such parameters immediately available or at least available prior to the arrival of a new and different K.

As described in sub-sections 4.2.3.2.3.1-4.2.3.2.3.3 of the 3GPP standard, a block of information of length K is to be stored in a matrix having R rows and C columns (i.e., an R×C matrix). Thus, K, R and C are interleaver parameters used to calculate the interleaver addresses. Different portions of the block of information of length K are stored in the matrix and such portions are retrieved in a certain order that complies with a pattern defined by the standard. In addition to K, R and C, the standard defines additional parameters that are used to calculate the interleaver addresses. K is given; i.e., it represents the length (in number of bits) of the block of information to be interleaved. The remaining parameters are determined as follows:

Determining R (Number of Rows in the Matrix)
If ($40 \leq K \leq 159$) the R=5;
If ($160 \leq K \leq 200$) or ($481 \leq K \leq 530$) then R=10;
If (K=any other value) then R=20.

At this point both K and R are known. According to the standard, the smallest possible prime number, p, that satisfies the condition $$p + 1 \geq \frac{K}{R}$$

is to be selected from a table. The table which is given by the standard is as follows:

| p | V | p | v | p | v | P | v | p | v |
|---|---|---|---|---|---|---|---|---|---|
| 7 | 3 | 47 | 5 | 101 | 2 | 157 | 5 | 223 | 3 |
| 11 | 2 | 53 | 2 | 103 | 5 | 163 | 2 | 227 | 2 |
| 13 | 2 | 59 | 2 | 107 | 2 | 167 | 5 | 229 | 6 |
| 17 | 3 | 61 | 2 | 109 | 6 | 173 | 2 | 233 | 3 |
| 19 | 2 | 67 | 2 | 113 | 3 | 179 | 2 | 239 | 7 |
| 23 | 5 | 71 | 7 | 127 | 3 | 181 | 2 | 241 | 7 |
| 29 | 2 | 73 | 5 | 131 | 2 | 191 | 19 | 251 | 6 |

-continued

| p | V | p | v | p | v | P | v | p | v |
|---|---|---|---|---|---|---|---|---|---|
| 31 | 3 | 79 | 3 | 137 | 3 | 193 | 5 | 257 | 3 |
| 37 | 2 | 83 | 2 | 139 | 2 | 197 | 2 | | |
| 41 | 6 | 89 | 3 | 149 | 2 | 199 | 3 | | |
| 43 | 3 | 97 | 5 | 151 | 6 | 211 | 2 | | |

As can be seen from the table, each value for p has an associated value for a parameter, v. Parameter v is a primitive root for a prime number, p. The parameter p and its associated primitive root, v, are intermediate parameters defined by the standard so as to provide the proper amount of randomness to the interleaver addresses that are generated based on such intermediate parameters.

Determining C (Number of Columns in the Matrix)
If ($K \leq R (p-1)$) then C=p-1;
If ($R(p-1) < K \leq R \cdot p$) then C=p;
If ($R \cdot p < K$) then C=p+1.

Determining the PRUNVAL Parameter

The matrix (R×C) determined from interleaver parameters may have more space than needed to store the K bit information block. A parameter known as PRUNVAL (pruning value) is calculated and is equal to the number of matrix locations that can be eliminated from the R×C matrix. Typically, the matrix locations at the end of the matrix are the ones that are pruned (i.e., eliminated). The pruning value is defined as ((R·C)−K).

Determining the S(i) Parameter for i=[0,1, . . . , p−2]

A parameter that is a sequence of values is also used to generate the interleaver addresses. Each interleaver address that is generated uses one value from this sequence of values to provide the interleaver address pattern being generated with the proper randomness dictated by the 3GPP standard. The sequence of values is referred to as S(i) ("Sequence of i") and it is derived from the value of K. More specifically, S(i) is defined recursively as equal to (v·S(i−1)) MOD p where S(0)=1 and i=[1, . . . , p−2]. Note that if K is known, then as described above, p can be determined and thus v is also determined which allows S(i) to be calculated. There can be up to 256 values for S(i) (i.e., when p=257), for a particular value of K, which represents a relatively large number of MOD operations.

MOD operations are essentially division operations which are typically implemented with relatively complex circuitry. Further, a circuit that can accommodate up to 255 MOD operations is not only complex but uses a relatively large amount of space and power. Moreover, the value of K typically changes as new blocks of information to be interleaved are applied to the interleaver. Therefore, for each new value of K, a new S(i) sequence and also new parameters (i.e., p, v, R, C) have to be calculated. Consequently, relatively large amounts of calculations using complex operations such as the MOD operations have to be performed every time K changes.

A known interleaver address generator requires, for each new value of K, the S(i) sequence to be calculated using a separate DSP along with memory circuitry to which the S(i) values are transferred. The interleaver address generator disclosed in the known art calculates addresses on an as-needed basis (i.e., "on the fly") to avoid large power hungry memory circuits. Because the interleaver in the known art calculates the interleaver addresses on the fly, the S(i) values for a particular value of i are available when needed by the interleaver address generator. Thus for each particular K value, the S(i) sequence is calculated externally (e.g., by a DSP) and stored in a memory circuit where particular S(i) values can be selected on the fly by the interleaver address generator disclosed in the known art. This interaction is time consuming and requires the use of a DSP, for which many MIPs (Million of Instructions per second) can be consumed by this process of calculating the S(i) values and filling the memory every time K changes.

Another possible approach for generating the S(i) sequence and the other parameters so that they are available on an as-needed basis would be to pre-calculate the parameters (including the S(i) sequence) for all possible values of K and store these values in memory circuits; it is clear that this approach would require a large amount of circuitry to implement. What is therefore needed is a hardware circuit that can calculate the interleaver parameter S(i) and the other parameters on an as-needed basis (on the fly) without having to use a separate DSP or without having to generate a relatively large table containing the parameters values for different values of block length or information length.

SUMMARY OF THE INVENTION

The present invention provides an interleaver parameter generator circuit for calculating and generating defined interleaver parameters on an as-needed basis where at least one of the defined parameters is calculated using a decomposed form of its definition. The generated parameters are used to generate interleaver addresses which are used to interleave information in accordance with a particular interleaving pattern. The interleaving pattern can be deterministic, or pseudorandom.

The parameter generator of the present invention comprises a processing circuit to which a first storage circuit and a second storage circuit are coupled. The processing circuit is configured to calculate the defined interleaver parameters based on at least one input parameter and where at least one defined parameter is calculated using a decomposed form of its definition. The first storage circuit contains a table of values of at least one of the defined parameters which table is used by the processing circuit to calculate the at least one defined parameter by properly selecting one of the stored values. The second storage circuit is used to store the parameter calculated using its decomposed form. All of the parameters calculated and generated (i.e., made available) by the parameter generator circuit of the present invention are based on one input parameter.

In one particular embodiment of the present invention the parameter generator is configured to generate interleaver parameters for interleaving information in a pseudorandom manner in accordance with the 3GPP standard TS 25.212 V4.2.0 (2001-09). The S(i) sequence parameters and parameters R, C, p, v and PRUNVAL are calculated based on the input parameter K. For a new value K, a new set of parameters (S(i), R, C, p, v and PRUNVAL) is calculated and made available prior to the next value of K. For the parameter S(i), for a new value of K, a new sequence S(i) is calculated and stored in the second storage circuit so that any specific sequence value S(i) for a particular value i is available on an as needed basis. Thus, theses parameters are calculated and generated on an as-needed basis. The S(i) sequence parameter is calculated by transforming its mathematical definition into a decomposed form that allows MOD operations to be achieved without having to use division circuitry or perform division operations.

DETAILED DESCRIPTION

Figure 1:
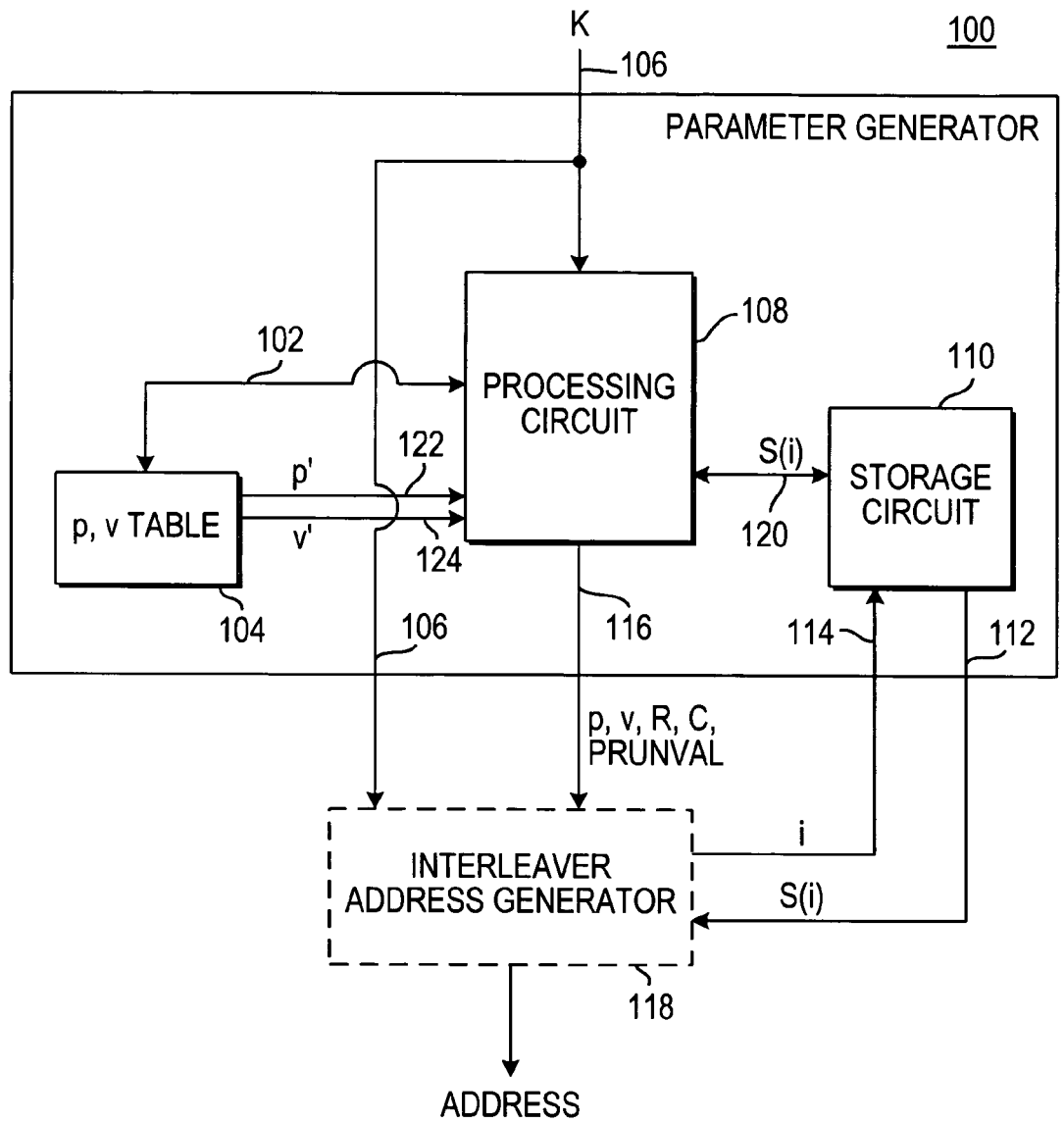
FIG. 1 is a block diagram of the parameter generator of the present invention.

The present invention provides an interleaver parameter generator circuit for calculating and generating defined interleaver parameters on an as-needed basis where at least one of the defined parameters is calculated using a decomposed form of its definition. The generated parameters are used to generate interleaver addresses which are used to interleave information in accordance with a particular interleaving pattern. The interleaving pattern can be deterministic or pseudorandom.

The parameter generator of the present invention comprises a processing circuit to which a first storage circuit and a second storage circuit are coupled. The processing circuit is configured to calculate the defined interleaver parameters based on at least one input parameter and where at least one defined parameter is calculated using a decomposed form of its definition. The first storage circuit contains a table of values of at least one of the defined parameters which table is used by the processing circuit to calculate the at least one defined parameter by properly selecting one of the stored values. The second storage circuit is used to store the parameter calculated using its decomposed form. All of the parameters calculated and generated (i.e., made available) by the parameter generator circuit of the present invention are based on one input parameter.

In one particular embodiment of the present invention the parameter generator is configured to generate interleaver parameters for interleaving information in a pseudorandom manner in accordance with the 3GPP standard TS 25.212 V4.2.0 (2001-09). The S(i) sequence parameter and parameters R, C, p, v and PRUNVAL are calculated based on the input parameter K. For a new value K, a new set of parameters (S(i), R, C, p, v and PRUNVAL) is calculated and made available prior to use by the known art interleaver. For the parameter S(i), for a new value of K, a new sequence S(i) is calculated and stored in the second storage circuit so that any specific sequence value S(i) for a particular value i is available on an as needed basis. Thus, theses parameters are calculated and generated on an as-needed basis. The S(i) sequence parameter is calculated by transforming its mathematical definition into a decomposed form that allows MOD operations to be achieved without having to use division circuitry or perform division operations. The decomposed form is the resulting formula or definition for a particular parameter obtained from mathematical manipulation or application of one or more algorithms to the original definition or formula of the parameter. It should be noted that the parameter generator of the present invention is not limited to the calculation and generation of parameters defined by the 3GPP standard. The parameter generator of the present invention is applicable to the calculation and generation of interleaver parameters for interleaving information in accordance with any type of interleaving pattern (e.g., pseudorandom, deterministic).

Referring to FIG. 1, there is shown a block diagram of an interleaver parameter generator circuit 100 of the present invention that generates parameters S(i), R, C, p, v, and PRUNVAL based on an input parameter K in accordance with the 3GPP standard TS 25.212 V 4.2.0 (2002-09) where the S(i) parameter and the other parameters are generated on an as-needed basis. Generation of the S(i) parameter on an as-needed basis means that for a certain value K from which p and v can be determined, an S(i) for i=[0,1, . . . , p−2] is calculated by processing circuit 108 which transfers the S(i) values to storage circuit 110 via path 120 where any specific sequence value for a particular i can be retrieved. Processing circuit 108 contains various logic circuits that calculate the parameters using the input parameter K on path 106 and parameters p' and v' (appearing on paths 122 and 124 respectively) retrieved from table 102. Calculated parameter S(i) when retrieved appears on path 112 while the other parameters appear on path 116. Path 116 can be implemented as a bus that carries the p, v, R, C and PRUNVAL parameters. The parameters used by interleaver address generator 118 are thus provided on paths 106 and 116.

The outputs of the interleaver parameter generator circuit of the present invention are applied to interleaver address generator 118 shown in dashed lines indicating that it is not part of the present invention. Consequently, interleaver address generator 118, which is disclosed in the known art referred to earlier in this specification, is thus able to generate interleaver addresses on an as needed basis.

Interleaver parameter generator circuit 100 of the present invention comprises processing circuit 108 coupled to p,v, table 104 and storage circuit 110. Storage circuit 110 is a general purpose storage circuit that can be implemented as a RAM (or other well known memory circuit) in which the calculated S(i) values are stored. Table 104 containing p and v values can be implemented as a ROM or any well known memory circuit. Processing circuit 108 generates a control signal onto path 102 causing p, v, table circuit 104 to output p' and v' values onto path 122 and 124 respectively which are processed by processing circuit 108 to determine whether they are correct; it is thus that the p, and v parameters are calculated by processing circuit 108 performing a search through the p, v table. Processing circuit 108 also calculates the remaining parameters (i.e., R, C and PRUNVAL) and makes them available along with p and v on path 116. Processing circuit 108 uses logic circuitry to calculate the various parameters including the S(i) values. For the calculation of S(i), a decomposed form of the mathematical equation defining S(i) is used; the particular decomposed form is discussed below. The logic circuitry comprise well known circuit blocks such as multipliers, adders, subtractors and comparators. Processing circuit 108 contains several logic circuits (200-208) used to calculate and generate the S(i) values and the remaining interleaver parameters (i.e., R, p, v, C and PRUNVAL) based on an input K on an as-needed basis.

Figure 2:
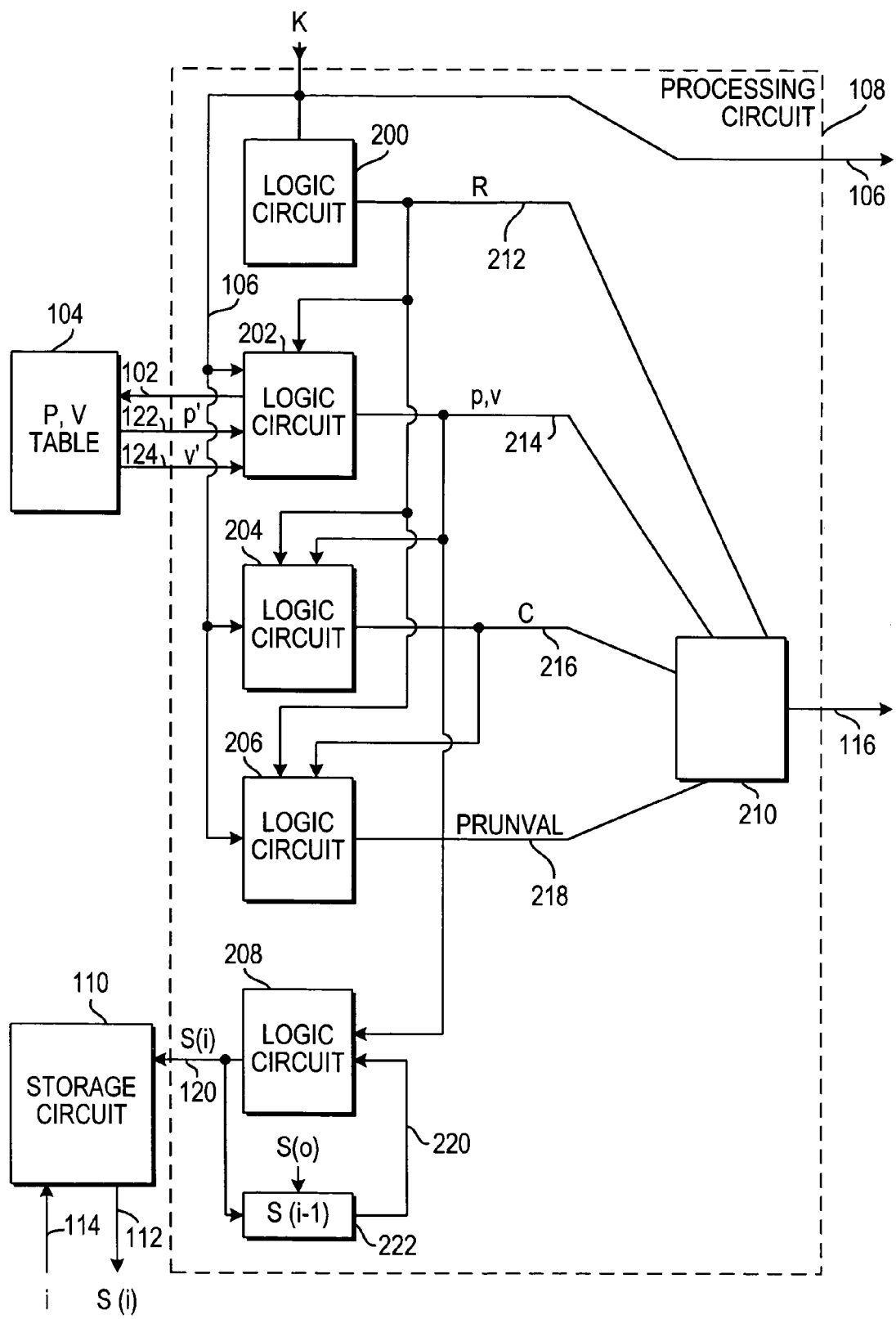
FIG. 2 is a block diagram of the processing circuit portion of the parameter generator circuit shown in FIG. 1.
Figure 3:
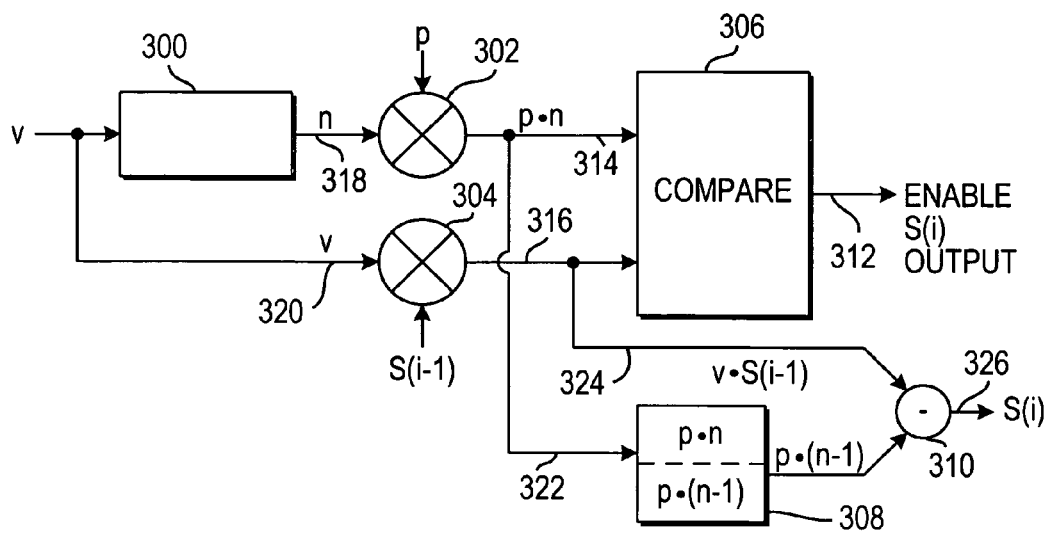
FIGS. 3-5 are block diagrams showing different logic circuit implementations for calculating the S(i) sequence.
Figure 4:
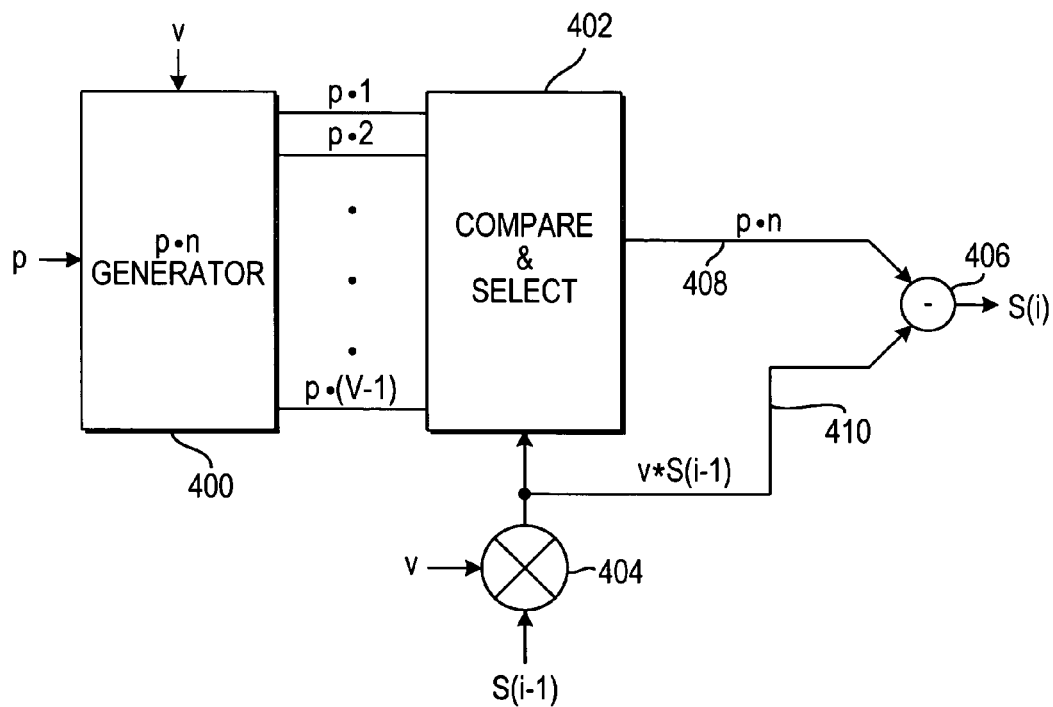
Figure 5:
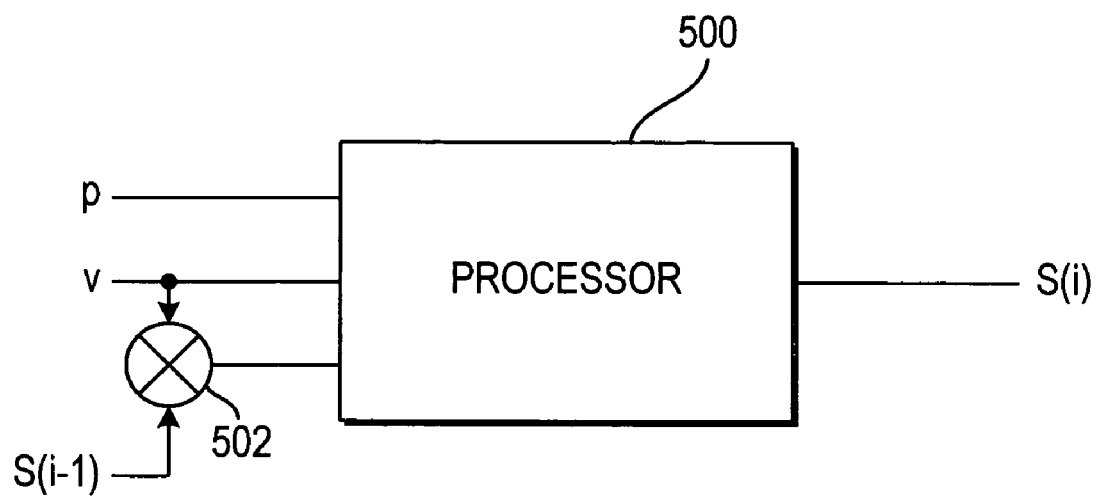

Referring now to FIG. 2 there is shown a block diagram of processing circuit 108. Logic circuit 200 is used to calculate the parameter R; logic circuit 202 is used to select the parameters p and v; logic circuit 204 is used to calculate the parameter C and logic circuit 206 is used to calculate the parameter PRUNVAL. Logic circuit 208 represents the hardware that is used to calculate S(i) value based on a decomposed form of the formula for S(i). The parameter generator of the present invention uses a particular decomposed formula for S(i) that avoids the use of division circuitry. Therefore, the decomposed form is more suitable for a hardware implementation for the calculation of the S(i). In particular, the decomposed form of the formula for S(i) is given as:

$$S(i) = v \cdot S(i-1) - p \cdot \text{floor}\left(\frac{v \cdot S(i-1)}{p}\right)$$

where floor is a "round down" function For example floor (5.1)=5, floor (8.9)=8; floor (6.0)=6. Further, no division operation is performed for the input term to the floor function. The input term for the floor function is $$\left(\frac{v \cdot S(i-1)}{p}\right)$$

which has a numerator v·S(i−1) and denominator p. To calculate p*floor $$\left(\frac{v \cdot S(i-1)}{p}\right),$$

the denominator p is multiplied by n for n=0,1, . . . , v−1 and the result of each such multiplication is compared to the numerator. The greatest p·n multiplication result that is not greater than the numerator is selected as the answer to the operation $$p * \text{floor}\left(\frac{v \cdot S(i-1)}{p}\right);$$

this result is subtracted from v·S(i−1) yielding S(i) as per the decomposed formula. Note that S(0)=1. Circuit 222, which can be a temporary register or temporary buffer or storage circuit, is used to store the previous S(i) or S(i−1). Thus, after each S(i) is calculated it is stored in buffer 222 for use in the next calculation of S(i). FIGS. 3-5 disclose three different approaches to the configuration of logic circuit 208. Processing circuit 108 and the other logic circuits can be implemented as an ASIC (Application Specific Integrated Circuit) constructed with semiconductor technology. Also, all of the logic circuits can be implemented with FPGA (Field Programmable Gate Arrays) or any other hardware blocks.

FIG. 3 shows a first configuration for logic circuit 208 which uses a relatively small amount of hardware. The value for v is applied to circuit 300. Circuit 300 generates a value for n per one or more clock cycles where n=1, . . . , v−1. For example, circuit 300 can be a counter that counts from 1 to v−1, stopping when p·n>v·s(i−1). The output of circuit 300, i.e., n, appears on path 318 and is applied to one input of multiplier 302. The parameter p, is applied to the other input of multiplier 302. The output of multiplier 302, i.e., p·n is on path 314 which is one of the inputs of compare circuit 306. The parameter v is applied to multiplier 304 via path 320. The other input to multiplier 304 is S(i−1). The output of multiplier 304, v·S(i−1), appears on path 316 which is the other input to compare circuit 306. Circuit 306 compares v·S(i−1) to the output of multiplier 302 for every value of n (in sequential order) and outputs an enable signal on path 312 when the current output of multiplier 302 is greater than v·S(i−1). Each output of multiplier 302 is stored into an 'input location' in memory circuit 308. Upon storing the current output of multiplier 302, i.e., p·n, into the 'input location' of memory circuit 308, the previously stored output of multiplier 302, i.e., p·(n−1), is shifted to another location in memory circuit 308 referred to as the 'output location.' Thus, when compare circuit 306 generates an enable signal, this indicates that the current output of multiplier 302, which is stored in the input location of memory circuit 308 is greater than v·S(i−1). More importantly, an enable signal also indicates that the value stored in the output location of memory circuit 308, i.e., p·(n−1), has the largest p·n value that is not greater than v·S(i−1). The value in the output location of memory circuit 308 is subtracted from v·S(i−1) with subtractor circuit 310 whose output is S(i). Thus, when the enable S(i) value goes high (i.e., logic high), the calculated S(i) is valid.

FIG. 4 shows a second configuration for logic circuit 208 which uses relatively more hardware than the configuration of FIG. 3, but probably calculates the S(i) in less than or equal to number of clock cycles than the circuit of FIG. 3. The parameters p and v are applied to pn generator circuit 400. Generator circuit 400 generates all values of n (n=1, . . . , v−1) in parallel and multiplies each generated n value by p thus generating p·1, p·2, p·3, . . . p·) (v−1). A multiple compare and select circuit 402 compares all of the generated pn values to v·S(i−1)—the output of multiplier 404—and selects the greatest pn value that is less than v·S(i−1). The output of compare and select circuit 402 appears on path 408 and is applied to subtractor 406 which subtracts v·S(i−1) (appearing on path 410) yielding S(i). Compare and select circuit 402 and pn generator circuit 400 contain well known combinatorial logic and sequential logic circuits. Various other circuits of intermediate size (i.e., less hardware than circuit of FIG. 4 or more hardware than the circuit of FIG. 3) and intermediate latency using well known logic circuit blocks can be devised to implement logic circuit 208; such a circuit could, for example, calculate 2 (or some other number of) products in parallel, namely p·n, p·(n−1) (and so on for higher degrees of parallelism). Multiple comparisons by a select and compare circuit (simpler than 402 but more complex than 306) would allow n to be incremented by values larger than 1 giving rise to intermediate solutions with latencies between the solutions shown in FIG. 3 and FIG. 4. FIG. 3 represents one possible design approach of a circuit having relatively high latency and a relatively small circuit area. FIG. 4 represents one possible design approach of a circuit having relatively low latency and a relatively large circuit area. Such other circuits depending on the particular design approach and the particular logic circuit blocks used can use more hardware than the circuit shown in FIG. 3 or less hardware than the circuit of FIG. 4. Therefore various types of circuits with various latency/area tradeoffs can be implemented for the interleaver parameter generator of the present invention.

Referring to FIG. 5, there is shown yet another implementation for logic circuit 208 in which a Processor 500 (e.g., Digital Signal Processor or Microprocessor) is used to perform the generation of the pn values (for n=1, . . . , v−1) and select the greatest pn value which is not greater than the output of multiplier 502 (i.e., v·S(i−1)) thus calculating $$p \cdot \text{floor}\left(\frac{v \cdot S(i-1)}{p}\right).$$

The generation of the pn values can be done in serially or in parallel fashion. The calculated pn value is subtracted from v·S(i−1) thus calculating S(i). Processor 500, which is coupled to the output of multiplier 502 and to which parameters p and v are applied, calculates S(i) as discussed above using well known logic circuits. Processor 500 may also be controlled by instructions (i.e., firmware or software program) which directs it to perform the calculations discussed above.

Returning to FIG. 2, it should first be noted that the S(i−1) value is obtained from register 222 and is applied to logic circuit 208 (for all three configurations) via path 220. The calculated S(i) is stored in storage circuit 110 via path 120. Any S(i) value can be retrieved via path 112 from storage circuit 110 based on the value of i appearing on path 114. The remaining parameters are calculated as per their definition. In particular, Logic circuit 200 calculates and generates R onto path 212. R is calculated based on the condition set by the 3GPP standard, which condition is repeated here for ease of reference:

Determining R (Number of Rows in the Matrix)
If(40≦K≦159) the R=5;
If (160≦K≦200) or (481≦K≦530) then R=10;
If (K=any other value) then R=20.

Based on the condition above, logic circuit 200 can be implemented with the proper stored constants and comparison circuitry. Note that the values of R are multiples of 2. Therefore, the value R=5 need only be stored in a shift register and the other two values of R (i.e., 10 and 20) can be obtained through one or two shifting operations.

Determining p and v

Logic circuit 202 is used to calculate the value of p based on R and K. The value of p is calculated based on a condition previously discussed supra, but which is replicated here for ease of reading. According to the aforementioned 3GPP standard the smallest possible prime number, p, that satisfies the condition $$p + 1 \geq \frac{K}{R}$$

is to be selected from the p,v table. The condition set by the standard for determining the value of p from the table above can be rearranged and thus expressed as R·p≧K−R which is more efficient for hardware implementation. Logic circuit 202 generates various addresses to search through p,v table 104. As each p' value and associated v' value are retrieved, they appear on paths 122 and 124 respectively and logic circuit 202 performs the comparison as defined above to determine the proper p and v values. The table 104 can be implemented as a ROM.

Logic circuit 204 calculates and generates the value for C onto path 216 based on the condition established for C by the 3GPP standard. Again, for ease of reading the condition for calculating C is repeated as follows:

Determining C (Number of Columns in the Matrix)
If (K≦R (p−1)) then C=p−1;
If (R(p−1)<K≦R·p) then C=p;
If (R·p<K) then C=p+1.

Based on the above condition, the value for C can be calculated using multiplier, adder, subtractor and comparison circuitry. The values for R, p, v and K are inputted to logic circuit 204 via paths 212, 214 and 106 respectively.

Determining PRUNVAL

Logic circuit 206 is used to calculate the PRUNVAL parameter which is calculated according to the formula PRUNVAL=((R·C)−K). The outputs of logic circuit 200 and 204 providing R on path 212 and C on path 216 respectively along with input K (on path 106) are used to calculate PRUNVAL. Logic circuit 206 can be implemented with multiplier and subtractor circuitry. Logic circuit 206 generates PRUNVAL onto path 218. The outputs of the logic circuits are applied to circuit 210 which outputs them onto bus 116 and are thus provided to Interleaver address generator 118 (see FIG. 1) via path 116. Circuit 210 is some type of combiner that is connected to output bus 116 onto which parameters R, p, v, C and PRUNVAL are provided.

The logic circuits shown in FIG. 2 as well as the rest of the parameter generator circuit of the present invention can be implemented with different types of semiconductor technologies or other technology such as optical technology. The different logic circuitry and storage circuitry disclosed are well known circuits that can be implemented in various ways with different types of circuit technologies. Although the parameter generator circuit of the present invention is discussed in the context of a hardware circuit, it will be readily obvious that the parameter generator approach of the present invention can be a method designed as one or more algorithms, viz., a method for generating defined interleaver parameters on an as-needed basis. The one or more algorithms can be implemented as a set of instructions that does not use any divide instructions (i.e., a computer program) to a general purpose computer for which K is an input and the p,v table is stored in a memory space that is accessible to the program. For the specific embodiment discussed above, the parameter R is first calculated from the value of K. The parameters p and v and then properly selected based on the values of K and R. The S(i) sequence is decomposed and then calculated from the values of p and v. Parameters C and PRUNVAL are calculated as per their definition. As with the hardware implementation, the set of parameters is calculated for each new value of K thus providing the interleaver parameters on an as-needed basis.

We claim:

1. An interleaver parameter generator comprising:
a processing circuit having at least one input to receive a corresponding input parameter and a plurality of outputs to provide a corresponding plurality of interleaver parameters to an interleaver during generation of interleaving patterns, wherein the processing circuit is configured to calculate said interleaver parameters based at least in part on a first input parameter, where at least one of the interleaver parameters is calculated during generation of the interleaving patterns using a decomposed form that implements modulus (MOD) operations without division.

2. The interleaver parameter generator of claim 1 further comprising a first storage circuit in which the at least one interleaver parameter calculated using the decomposed form is stored where the first storage circuit is coupled to the processing circuit.

3. The interleaver parameter generator of claim 1 where the processing circuit comprises at least one logic circuit used to calculate at least one interleaver parameter.

4. The interleaver parameter generator of claim 1 where the processing circuit is an ASIC.

5. The interleaver parameter generator of claim 1 where the processing circuit is constructed with FPGA circuitry.

6. The interleaver parameter generator of claim 1 where the interleaver parameters include at least one of R, C, p, v, PRUNVAL and S(i) and said interleaver parameters are calculated using logic circuits as part of the processing circuit, where the at least one interleaver parameter calculated using the decomposed form defines S(i).

7. The interleaver parameter generator of claim 6 where a first logic circuit calculates S(i) and comprises:
a counter circuit that provides values for n=1, . . . , v−1;
a first multiplier used to calculate v·S(i−1);
a second multiplier used to calculate p·n for n=0, 1, . . . , v−1;
a compare circuit coupled to the first multiplier and the second multiplier so as to generate an enable signal indicating p·n is greater than v·S(i−1);
a memory circuit coupled to the second multiplier to store p·n values for at least n and n−1; and
a subtractor circuit coupled to the first multiplier and the memory circuit so as to calculate v·S(i−1)−p·(n−1) for S(i).

8. The interleaver parameter generator of claim 6 where a first logic circuit calculates S(i) and comprises:
a pn generator circuit that generates p·n values for n=1, . . . , v−1;
a multiplier circuit to calculate v·S(i−1);
a compare and select circuit, coupled to the pn generator circuit and multiplier circuit, which compares the p·n values to v·S(i−1) and selects the largest p·n value that is not greater than v·S(i−1); and
a subtractor circuit coupled to the multiplier circuit and to the compare and select circuit to calculate S(i)=v·S(i−1)−p·n for said largest p·n value.

9. The interleaver parameter generator of claim 6 where a first logic circuit calculates S(i) and comprises:
a multiplier that calculates v·S(i−1);
a processor, coupled to the multiplier, to generate p·n values for n=1, . . . , v−1, select the greatest p·n value that is not greater than v·S(i−1), and subtract said greatest p·n value from v·S(i−1) thus calculating S(i).

10. The interleaver parameter generator of claim 1, further comprising:
a first storage circuit containing possible values for first and second interleaver parameters and from which said first and second interleaver parameters are calculated, where the first storage circuit is coupled to the processing circuit.

11. The interleaver parameter generator of claim 1, the processing circuit configured to receive an input parameter K indicative of a block length for information to be stored in a matrix having R rows and C columns and generate S(i) sequence parameter values for i=0, 1, ., ., ., p−2, where p is a smallest possible prime number that satisfies the condition $$p+1 \geq \frac{K}{R},$$

based at least in part on a decomposed form that implements modulus (MOD) operations without division, the interleaver parameter generator further comprising:
a storage circuit, in communication with the processing circuit, to store said S(i) sequence parameter values for use by an interleaver during generation of interleaving patterns.

12. The interleaver parameter generator of claim 11 wherein the processing circuit generates the S(i) sequence parameter values during generation of the interleaving patterns.

13. The interleaver parameter generator of claim 11, the processing circuit including:

a logic circuit to receive the input parameter K and generate interleaver parameter values for R rows of the matrix based at least in part on said input parameter K.

14. The interleaver parameter generator of claim 11, the processing circuit including:

a logic circuit to receive the input parameter K and generate interleaver parameter values for the smallest possible prime number (p) that satisfies the condition $$p+1 \geq \frac{K}{R}$$

and a primitive root (v) of said prime number based at least in part on said input parameter K and interleaver parameter values for R rows of the matrix.

15. The interleaver parameter generator of claim 11, the processing circuit including:

a logic circuit to receive the input parameter K and generate interleaver parameter values for C columns of the matrix based at least in part on said input parameter K and interleaver parameter values for R rows of the matrix, the smallest possible prime number (p) that satisfies the condition $$p+1 \geq \frac{K}{R},$$

and a primitive root (v) of said prime number.

16. The interleaver parameter generator of claim 11, the processing circuit including:

a logic circuit to receive the input parameter K and generate interleaver parameter values for a number of locations that can be pruned from the matrix (PRUNVAL) based at least in part on said input parameter K and interleaver parameter values for R rows of the matrix, and C columns of the matrix.

17. A method for generating an interleaver parameter using the interleaver parameter generator of claim 1, comprising:

a) receiving an input parameter K indicative of a block length for information to be stored in a matrix having R rows and C columns;

b) generating S(i) sequence parameter values for i=0, 1, ., ., ., p−2, where p is a smallest possible prime number that satisfies the condition $$p+1 \geq \frac{K}{R},$$

based at least in part on a decomposed form that implements modulus (MOD) operations without division; and c) storing said S(i) sequence parameter values for use by an interleaver during generation of interleaving patterns.

18. The method of claim 17 wherein the generating in b) is during generation of the interleaving patterns by the interleaver.

19. The method of claim 17, further including:

d) receiving the input parameter K; and e) generating interleaver parameter values for R rows of the matrix based at least in part on said input parameter K.

20. The method of claim 17, further including:

d) receiving the input parameter K; and e) generating interleaver parameter values for the smallest possible prime number (p) that satisfies the condition $$p+1 \geq \frac{K}{R}$$

and a primitive root (v) of said prime number based at least in part on said input parameter K and interleaver parameter values for R rows of the matrix.

* * * * *